United States Patent [19]

Boenning et al.

[11] Patent Number: 5,339,038

[45] Date of Patent: Aug. 16, 1994

[54] ASSEMBLY FOR DETECTING AND LOCATING CABLE PINCHING

[75] Inventors: Robert A. Boenning, Timonium, Md.; Karl F. Schoch, Jr., Penn Hills, Pa.; Daryl V. Stough, North Huntingdon, Pa.; Francis W. Navish, Jr., East Pittsburgh, Pa.

[73] Assignee: Westinghouse Electric Corporation, Pittsburgh, Pa.

[21] Appl. No.: 910,854

[22] Filed: Jul. 6, 1992

[51] Int. Cl.5 .......................................... G01R 31/02
[52] U.S. Cl. .................................... 324/539; 324/543; 340/550; 174/106 SC; 174/120 SC
[58] Field of Search .............. 324/539, 541, 543, 544, 324/551, 555, 557; 340/550, 647, 650; 174/106 SC, 115, 120 SC

[56] References Cited

U.S. PATENT DOCUMENTS

| | | | |
|---|---|---|---|
| 3,049,584 | 8/1962 | D'Ascoli | 174/120 SC |
| 3,878,319 | 4/1975 | Wahl | 174/106 SC |
| 4,132,858 | 1/1979 | Anderson et al. | 174/120 SC |
| 4,301,399 | 11/1981 | Miller et al. | 324/541 |
| 4,469,538 | 9/1984 | Wade et al. | 174/115 X |
| 4,803,309 | 2/1989 | Marin et al. | 174/106 SC |
| 4,859,989 | 8/1989 | McPherson | 340/510 |
| 4,926,129 | 5/1990 | Wasley et al. | 324/555 |
| 4,935,699 | 6/1990 | Boenning | 324/555 |
| 4,954,811 | 9/1990 | Chatigny et al. | 340/550 |
| 4,988,949 | 1/1991 | Boenning | 324/541 |
| 5,043,538 | 8/1991 | Hughey, Jr. et al. | 174/106 SC |
| 5,101,161 | 3/1992 | Walsh et al. | 324/543 |
| 5,281,757 | 1/1994 | Marin et al. | 174/106 SC X |

Primary Examiner—Kenneth A. Wieder
Assistant Examiner—Glenn W. Brown

[57] ABSTRACT

An assembly for protecting a conduit having a core and an axial length, which length is susceptible to being pinched by a structure is disclosed. The conduit includes an insulating coating in surrounding relationship about the core, with the assembly including a semiconductive layer in surrounding relationship about the insulating coating, and a switching layer in surrounding relationship about the semiconductive layer. The semiconductive layer being formed from partially vulcanized ethylene propylene rubber including particles of a conductive element in the form of carbon black, silver, nickel, aluminum or the like. The switching layer is non-conductive in its unstressed state and conductive when pinched such that the switching layer completes a current flow path between the semiconductive layer and either a grounded structure or another conductive layer, which condition may then be detected.

31 Claims, 3 Drawing Sheets

ASSEMBLY FOR DETECTING AND LOCATING CABLE PINCHING

BACKGROUND OF THE INVENTION

Technical Field

This invention relates generally to the field of cable failure detection and more particularly to an assembly for detecting and locating cable pinching prior to the cable failure associated therewith.

Background Art

It is well known that cable pinching occurs when a cable which forms a portion of an electrical or other type of control system contacts the system hardware or structure and is squeezed by a second structural member or replaceable unit. This squeezing contact can result from the frequent removal and installation of a replaceable unit to which the cable is attached or adjacent to.

Since control cables, and particularly electrical cables, are frequently embedded in the control system and, thus, hidden from view, the pinching of such cables often goes undetected. The failure of the cable occurs when the protective insulation surrounding the cable's current carrying conductor or fluid carrying inner portion erodes sufficiently to allow the conductor to come into contact with a grounded portion of the system structure or forms a hole through the fluidic member.

As mentioned above, this failure may occur due to pinching of the cable in a concentrated area which may at first be relatively insignificant; however, such pinching condition may eventually lead to a progressive failure due to chafing caused by vibrations which abrade the cable. Grounding the current carrying conductor not only results in an interruption of the current flow to the load device connected to the cable, but also can result in damage to the current producing power supply and ultimately result in the failure of the particular control mechanism.

Such failures are of particular concern in aircraft and similar applications where human life is involved and it is not practical to routinely check locations of potential failures. In addition, it may be very time consuming to locate an actual fault or other defective condition known to exist. Illustrating the foregoing serious problem which can arise as a result of undetected cable pinching, one may particularly consider the electrical and control systems of an aircraft. These systems predominantly utilize unarmored cables in order to reduce the aircraft's overall weight. It is readily apparent that the failure of an aircraft cable during flight, as a result of pinching between a structural member or replaceable unit and a grounded air frame, can potentially cause engine failure and the loss of essential navigational instrumentation. Obviously, these situations would greatly endanger the safety of all onboard personnel, as well as unsuspecting bystanders on the ground.

In an effort to overcome the aforementioned shortcomings, U.S. Pat. No. 4,859,989 issued to McPherson, discloses a security system and signal carrying member forewarning of attempted interference with an object being protected; however, such a system requires that the semiconductive fibers forming the semiconductive layer protrude from the layer when the layer is pierced and/or consequently requires that the cable be severed or significantly damaged prior to the transmission of a signal illustrative of cable damage. The foregoing system is designed to deter piracy of data carrying cables such as telephone or computer lines and to pinpoint the location at which such piracy has occurred. Consequently, it requires that significant damage or total severance of the cable occur before a distress signal is generated. When such system is used for detecting imminent failure of a core which is fundamental to the safety or operation of a control system such as that used in aircraft hydraulic systems, electrical systems or navigational control systems, the possibility that the protruding fibers will not contact the subsequent layer and generate the distress signal before such has rendered the affected system inoperable would clearly exist and, thus, would not protect individuals associated with such equipment.

In addition to the foregoing, U.S. Pat. No. 4,935,699, issued to Boenning and assigned to the assignee of the subject application, the contents of which are hereby incorporated herein by reference, discloses a device for detecting and locating pinching and chafing of conduits. This reference sets forth a system for accurately detecting pinching in an electrical conductor and includes a resiliently compressible electrical switching layer which is nonconducting when not pinched and conducting when pinched. The resiliently compressible switching layer is positioned adjacent a semiconductive layer such that when pinching of the cable occurs, a substantial increase in the conductivity through the resiliently compressible electrical switching layer effectively grounds the inner semiconductive layer. This condition then activates the alarm circuit which is indicative of a pinch and a voltage is then converted to a digital signal by an AD converter in order to indicate the location of the pinch. However, it has been found that in order for the abovementioned device to operate as intended, particular formulations of the various layers must be employed in order to reliably and accurately detect and locate pinching of the cable.

In addition to the aforementioned shortcomings associated with the prior art devices, it is to be noted that these devices are incapable of being reliably retrofitted to cables of control systems presently employed in aircraft or other vulnerable equipment which leaves such existing equipment vulnerable to catastrophic failure associated with the pinching of such cables.

Clearly, there is a need for a simplistic and reliable assembly for use with cable pinching detecting equipment. Moreover, there is a need for a device which may accurately detect cable pinching in both newly manufactured systems, as well as those presently in existence, in order to minimize the likelihood of catastrophic failure occurring in both new equipment as well as presently existing equipment.

SUMMARY OF THE INVENTION

The principal object of the present invention is to overcome the shortcomings associated with the prior art devices discussed above.

Another object of the present invention is to provide a semiconductive layer and switching layer in combination which may be either retrofitted to cables of existing vulnerable equipment or applied to new equipment during the manufacturing process.

Yet another object of the present invention is to provide a semiconductive layer of a particular composition so as to achieve a predetermined requisite resistance required for accurately detecting and locating cable pinching.

These as well as additional objects of the present invention are achieved in accordance with the preferred embodiment thereof by producing an assembly for use in a pinching detection and location system for application to a conduit having a core and an insulating layer surrounding the core with the conduit having a length which may be susceptible to pinching. The assembly includes a semiconductive layer formed of a partially vulcanized ethylene propylene rubber, for example, including carbon particles and particles of a conductive material chosen from the group including silver, nickel and aluminum, such semiconductive layer being capable of conducting a detection current and a switching layer for conducting the detection current when the conduit to which the assembly is applied is pinched at a point along its length. The switching layer being formed of a resiliently compressible material which may include reinforcing fibers in the form of a plurality of longitudinally extending fiberglass threads embedded in the switching layer.

The assembly may be readily provided in the form of a multi-layer tape which may be retrofitted to existing vulnerable equipment, as well as new equipment.

In order to assure proper positioning of the semiconductive layer and switching layer, it is preferred that the semiconductive layer be of a partially vulcanized ethylene propylene rubber, for example, filled with carbon particles as well as the aforementioned conductive particles such as silver, aluminum and nickel. The partially vulcanized ethylene propylene rubber possesses self-welding properties, which when in physical contact with itself welds or fuses together thereby forming a cylindrical sheath about the cable. Further, the partially vulcanized rubber is tacky in nature and thus when the layers are applied about the insulating layer of a conduit, the positioning thereof will be assured with respect to the conduit. Alternatively, a pressure sensitive adhesive layer may be provided between the semiconductive layer and the insulating layer of the conduit. The adhesive layer likewise assures the positioning of the multi-layer assembly with respect to the conduit.

As previously discussed, an alarm/location circuit may then be electrically connected to the semiconductive layer such that when the switching layer is pinched by contact with a grounded structure, an observable signal indicative of such condition and location is generated. An exemplary alarm/location circuit is disclosed in U.S. Pat. No. 4,935,699 issued to Boenning and assigned to the assignee of the subject application. Preferably, the semiconductive layer is formed of partially vulcanized ethylene propylene rubber including carbon particles and conductive particles of silver, aluminum, nickel or the like. Alternatively, the semiconductive layer of the assembly may be formed from a polymer including carbon black, a polymeric binder and a conductive element such as silver, nickel, aluminum or the like, that possesses the requisite self-welding properties of partially vulcanized ethylene propylene rubber.

The assembly in accordance with the preferred embodiment of the present invention achieves the resistance per unit length which is independent of the width of the tape and inversely proportional to the diameter of the conduit to be protected. That is, the preferred resistivity of the semiconductive layer is 0.267 ohm-cm for a 0.004 inch thick layer. Accordingly, for a 1 inch conduit, the resistance would be 100 ohms/ft while for a half-inch conduit, the resistance would 200 ohms/ft.

These, as well as additional advantages of the preferred embodiment of the present invention as well as alternative embodiments will become apparent from the following detailed description of the present invention with reference to the several figures.

DETAILED DESCRIPTION OF THE INVENTION

Figure 1:
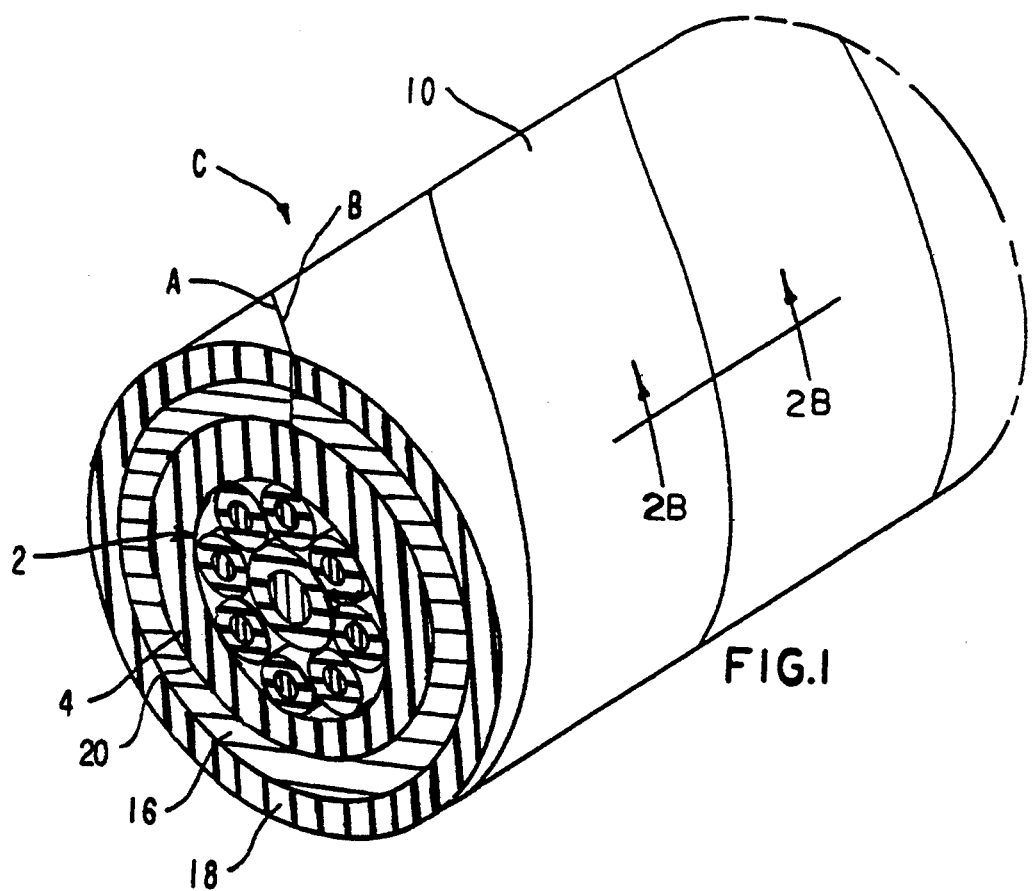
FIG. 1 is a cross-sectional perspective view of a cable or conduit employing a composite tape for cable pinching detection and location in accordance with a preferred embodiment of the present invention.
Figure 2A:
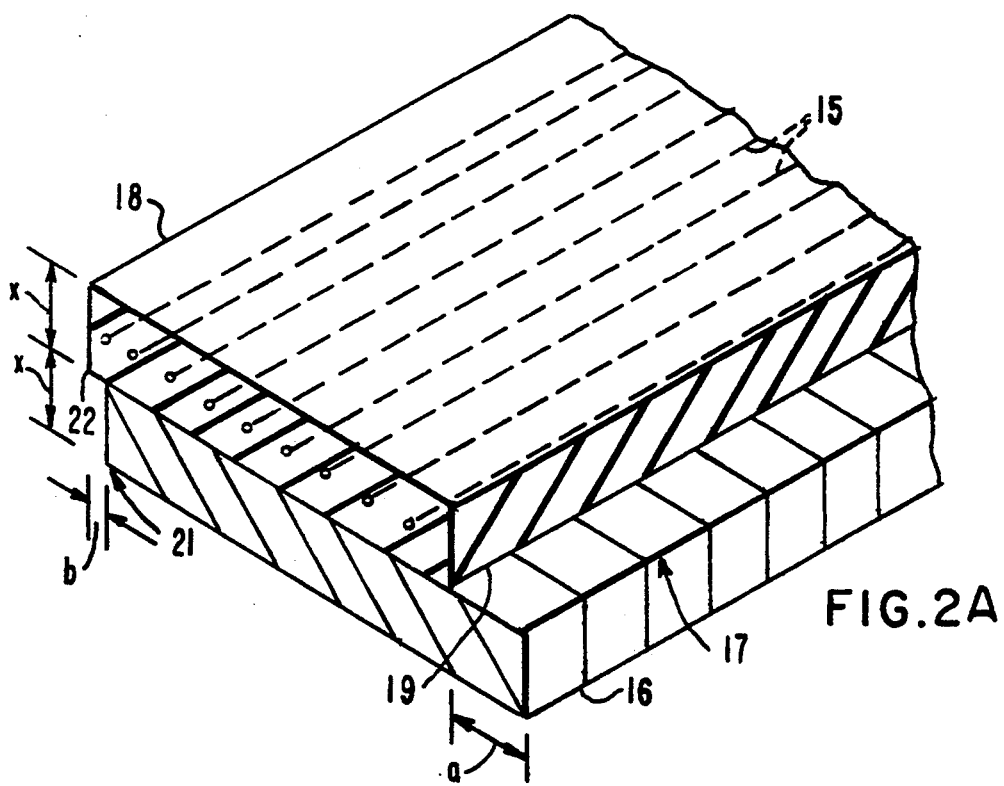
FIG. 2A is a cross-sectional perspective view of the composite tape for cable pinching detection and location in accordance with the preferred embodiment of the present invention.
Figure 2B:
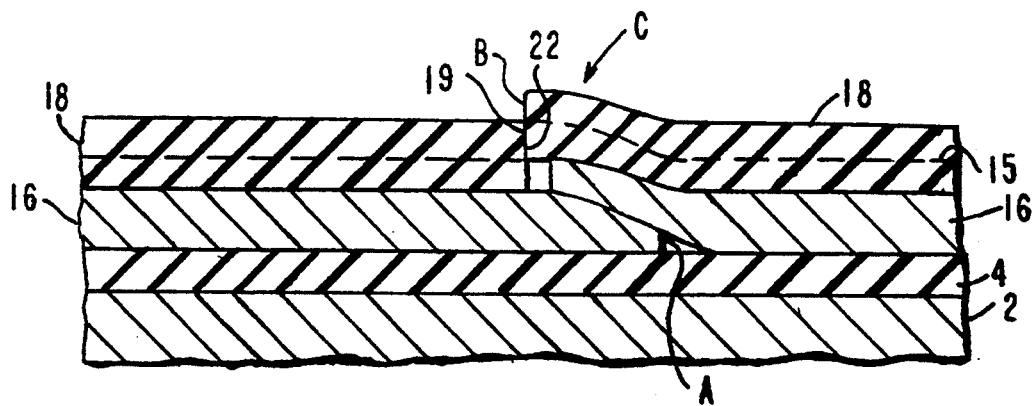
FIG. 2B is a cross-sectional view of the composite tape illustrated in FIG. 1 taken along line 2B—2B thereof.
Figure 3:
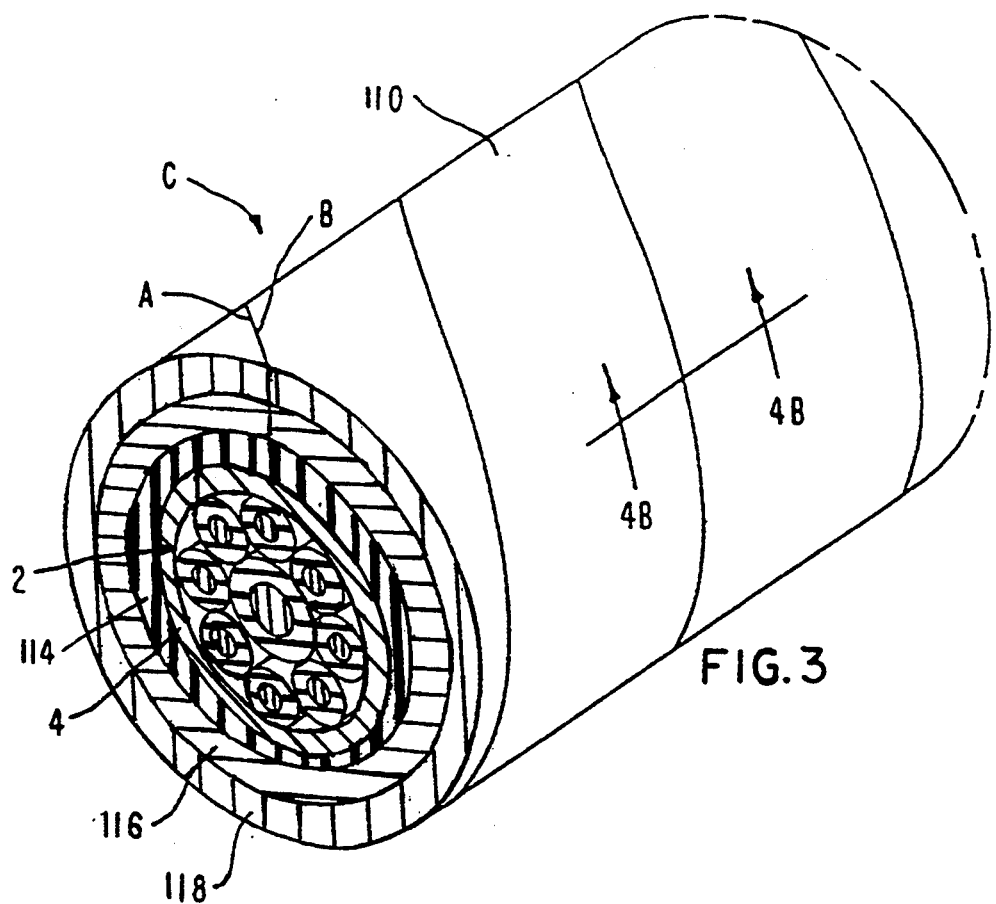
FIG. 3 is a cross-sectional perspective view of the cable or conduit employing a multi-layered tape for cable pinching detection and location in accordance with an alternative embodiment of the present invention.

Referring to the drawings, and particularly to FIGS. 1, 2A and 2B, a preferred embodiment of the present invention includes a cable C surrounded by an assembly for detecting cable pinching in accordance with the present invention. More specifically, illustrated is a cable C surrounded by a composite tape 10 in accordance with the present invention. The cable C includes a central conductor or plurality of conductors 2 and an insulating sheath 4. While the conductors shown in FIGS. 1 and 3 are illustrated as electrical conductors, the cable C may be a hydraulic or pneumatic hose or any other type elongated medium transport-type cables. Applied to an outer surface 20 of the insulating sheath 4 is the composite tape 10 illustrated in accordance with the preferred embodiment of the present invention. The composite tape, itself, is illustrated in FIGS. 2A and 2B.

The composite tape 10 is formed of two layers, the first being a semiconductive layer 16 which is to be positioned in contact with the outer surface 20 of the insulating sheath 4 of the cable C and a switching layer 18 as is shown in FIG. 1.

The semiconductive layer 16 is preferably formed of a partially vulcanized ethylene propylene rubber material, for example, filled with carbon particles which is similar to SCOTCH #13 semiconducting ethylene propylene rubber tape manufactured by 3M Corporation. In order to achieve the requisite resistivity, particles of silver, nickel, aluminum or the like are added to the partially vulcanized ethylene propylene rubber material. The partially vulcanized rubber material by nature is tacky and when brought into contact with the outer surface 20 of the insulating sheath 4 of the cable C, will adhesively secure the composite tape 10 in place about the cable C. The switching layer 18 is formed in a manner set forth in greater detail hereinbelow. The switching layer 18 includes silver coated hollow glass spheres or beads dispersed throughout a flexible polymer matrix.

Referring now to FIG. 2A, it can be noted that the semiconductive layer 16 is offset from the overlying switching layer 18, the purpose of which will be discussed in greater detail hereinbelow. The switching layer 18 may be provided with reinforcing fiberglass threads 15 which add additional strength to the composite tape 10 so that such tape will not buckle or deteriorate during use. The fiberglass threads 15 extend in a substantially longitudinal direction along the length of the composite tape 10.

The underlying semiconductive layer 16 includes a lapping edge 17 which is spaced a predetermined distance a from the edge 19 of the switching layer 18. This predetermined distance is in the range of 0.10 to 0.20 inches and is preferably 0.125 inches. The laterally opposing edge 21 of the semiconductive layer 16 is similarly recessed inwardly from the lateral edge 22 of the switching layer 18 a predetermined distance b which is in the range of 0.020 to 0.040 inches and preferably 0.031 inches. It should be noted that each of the predetermined distances a and b may vary and their particular magnitude will be dependent upon the size and nature of use for the composite tape 10. Both the semiconductive layer 16 and the switching layer 18 are of a predetermined thickness x which may vary dependent upon the application of the composite tape 10, however, each of these layers are preferably 0.004 inches in thickness.

As can be seen from FIG. 2B, when wrapped in the manner illustrated in FIG. 1 about the cable C, the edges A and B of the composite tape 10 will overlap in order to assure that protection of the cable C is uninterrupted along its entire length. As is illustrated in FIG. 2B, the partially vulcanized rubber material of which the semiconductive layer 16 is formed, is compressible along the edges thereof in order to bring the lateral edges 19 and 22 of the switching layer 18 into contact with one another. Consequently, by providing the recessed area along the length of the composite tape, the partially vulcanized rubber material is prevented from being exposed along the lateral edges thereof and permits the edges 19 and 22 of the switching layer 18 to mate with one another in order to ensure that the entire semiconductive layer 16 is covered. The partially vulcanized rubber material possesses self-welding properties when placed in physical contact with itself and thus essentially fuses together in this area. Accordingly, a continuous semiconductive sheath is provided about the cable C with this continuous semiconductive sheath being completely covered by the switching layer 18. By providing the overlapping of the semiconductive layer 16 and thus, a continuous semiconductive sheath, the resistance per unit cable length is prevented from increasing rapidly with large diameter cables and permits the accurate location of a point at which cable pinching occurs.

With the aforementioned preferred embodiment, the continuous semiconductive sheath formed by the semiconductive layer 16 results in a resistance per unit length that is independent of the width of the tape and which is inversely proportional to the diameter of the cable. With the foregoing preferred embodiment, the preferred value for the resistivity of the semiconductive layer 16 which is approximately 0.004 inches thick, is preferably in the range of 0.0133 to 0.667 ohm-cm and preferably 0.267 ohm-cm as will be discussed in greater detail hereinbelow. With this preferred resistivity, the resultant resistance per foot of cable is 200 ohms for a cable having a diameter of one-half inch and 100 ohms for a cable having a diameter of one inch. Accordingly, it can be determined from the following equation that the resistance of the semiconductive layer is independent of the width of the tape used to form such layer and inversely proportional to the diameter of the cable.

The following equation is useful in determining the resistivity of the semiconductive layer material to be used.

$$R = \frac{l\rho}{A}$$

Where R is a predetermined resistance in this case 200 ohms, A is the cross-sectional area of the semiconductive layer, l is the tape length, in this case one foot (30.48 centimeters), and $\rho$ is the resistivity of the semiconductive material. Accordingly for a semiconductive layer having a thickness of 0.004 inches (0.0102 centimeters) and a cable having a diameter of ½ inch (1.27 centimeters), the resistivity $\rho$ would equal:

$$\rho = \frac{RA}{l}$$

or $$\rho = \frac{(200 \text{ ohms})(.0102 \text{ cm})(1.27 \text{ cm})\pi}{30.48 \text{ cm}}$$

$$\rho = .267 \text{ ohm} - \text{cm}$$

Because the overlapped lateral edges of the partially vulcanized rubber tape bond to one another, the semiconductive layer can be considered to be a cylindrical sheath. The resistance per foot of cable can then be determined in the following manner:

$$R \text{ ohms/sq} = \frac{l\rho}{TW}$$

Where R is the resistance per square, $\rho$ is the resistivity, l is the length of the square, W is the width of the square and T is the cross-sectional thickness of the square. Further, because the area in question is a square, l is equal to W. Therefore:

$$R \text{ ohms/sq} = \frac{.267 \text{ ohm-cm}}{.0102 \text{ cm}} = 26.18 \text{ ohms/sq}.$$

In order to convert the above resistance from ohms per square to ohms per foot of cable, the following conversion factor is used:

$$R \text{ ohms/ft} = 26.18 \text{ ohms/sq} \cdot \frac{12 \text{ in/ft}}{\pi D}$$

where D is the diameter of the cable in inches. Accordingly, for R=26.18 ohms/sq., the resistance per foot of cable equals:

$$R \text{ ohms/ft} = \frac{100}{D \text{ in}}$$

Therefore, it can be noted that the resistance per foot of cable is independent of the width of the semiconductive tape, and inversely proportional to the diameter of the cable. Accordingly, a cable having a diameter of one inch would exhibit a resistance of 100 ohms/ft while a cable having a diameter of one half inch would exhibit a resistance of 200 ohms/ft.

In order to repair a pinched section of the foregoing protected cable which may be damaged due to excessive pinching of the composite tape, the portion of the switching layer adjacent to and including the pinched portion is peeled away from the semiconductive layer due to a non-permanent bond therebetween, thus exposing the semiconductive layer.

If the semiconductive layer is damaged, the damaged semiconductive layer can be removed by carefully cutting through the partially vulcanized rubber material and peeling it away, leaving a portion remaining for example, 0.25 inch, at each side of the area to be repaired. A new piece of composite tape can then be wrapped over the repair area, overlapping the remaining ends of the semiconducting layer, which will subsequently weld together with the new semiconductive layer and restore the integrity of the semiconductive layer.

It is imperative that the switching layer 18 be formulated of a material which changes from a non-conductive material to a conductive material when mechanically strained. Accordingly, when the cable is pinched, the switching layer will thus become conductive and complete a circuit between the semiconductive layer and a grounded structure. This pinching condition would then be recognized by the above-mentioned pinching detection and location device.

In order to form the switching layer in accordance with the present invention, it is imperative that the conductive filling material be dispersed throughout a flexible polymer matrix. For this purpose, silver coated hollow glass spheres or beads are dispensed throughout a flexible polymer matrix such as a silicone or polyurethane polymer. It is to be noted that any suitable conductive material may be used for coating the hollow glass spheres as long as the resultant layer exhibits the requisite characteristics. For the purposes of illustration, silver has been chosen. Hollow glass spheres were selected because they are of low density and cost, and will remain evenly suspended in the flexible polymer matrix.

For purposes of illustration, two types of polymer matrix materials have been used, one being silicone and the other being polyurethane, however numerous materials having similar characteristics could likewise be used in accordance with the present invention. It should be noted that within each class of polymers, a variety of materials are available and consequently a range of mechanical properties are readily accessible.

Tests were carried out using each of the aforementioned polymers, the first being silicone. The particular material used was Dow-Corning 732 sealant supplied direct from the manufacturer. An aloquate of silicone was then extruded from a tube and silver coated hollow glass spheres such as Metallite Silver microspheres, were added and intimately mixed within the silicone material. The resultant mixture was then drawn into a thin film and left to cure in ambient air overnight. After such time the film was removed and subsequently tested. Three test films were manufactured consisting of 10, 20 and 30% filler contents respectively.

A second test material was subsequently prepared. The polyurethane matrix material was prepared by intimately mixing one equivalent of polyoxytetramethylene glycol having a molecular weight of 2000 (PTMG 2000) with 4.5 equivalents of a mixture comprising 0.05 equivalents of trimethylolpropane (TMP) and 0.95 equivalents of 1,4-Butanediol (BD). It should be noted that if the PTMG 2000 is in a solid state (solidification point of PTMG 2000 is approximately 25° C.) the material is melted by gently warming and pouring it into a mixer container at a temperature of approximately 35° C. The TMP/BD mixture was then added to the PTMG 2000 and agitated in order to intimately mix such materials. Once these materials had been mixed, Metallite Silver microspheres were then added to the intimate mixture under agitation. Microspheres in the range of 20–30% by weight of the entire polymer formulation were added. Once the microspheres had been sufficiently dispersed throughout the mixture, 5.5 equivalents of PAPI 94 was added under agitation to the mixture at a temperature of approximately 25° C. After each element had been added to the mixture, the mixture was thoroughly agitated or stirred in order to achieve a smooth mixture.

The above mentioned equivalent ratios of PAPI 94: PTMG 2000: Tm/BD of 5.5: 1.0: 4.5; respectively, translates to 721.6 parts by weight of PAPI 94 when its equivalent weight is 131.2, 991.17 parts by weight of PTMG 2000 when its hydroxyl number is 56.6 and 202.5 parts by weight of BD. The resulting quantity of Metallite Silver microspheres is in the range of 478.8 to 820.83 parts by weight of the total mixture when the quantity of Metallite Silver microspheres is in the range of 20–30% by weight of the total mixture for the above ratios of diisocyanate and polyols. Preferably, the microspheres are approximately 10 microns in diameter.

Once the material was prepared in accordance with the foregoing, the resultant mixture was poured into a 0.001 inch thick strip and cured overnight at ambient temperature and humidity and conditioned at ambient temperature and humidity for approximately 7 days. Once conditioned, the material was tested in the following manner.

Each of the foregoing tapes were evaluated by wrapping such tape around a cable between conducting braids and pinching such material between ohm meter probes. Such quantitative testing illustrated that both materials were successful in exhibiting pinching with a variety of resultant sensitivities. The silicone exhibited the highest degree of sensitivity even when the silver coated spheres amounted to only 10% of the total mixture by weight. Accordingly, the particular materials chosen for use as the switching layer 18 will be directly dependent upon the particular application and the sensitivity desired.

Figure 4B:
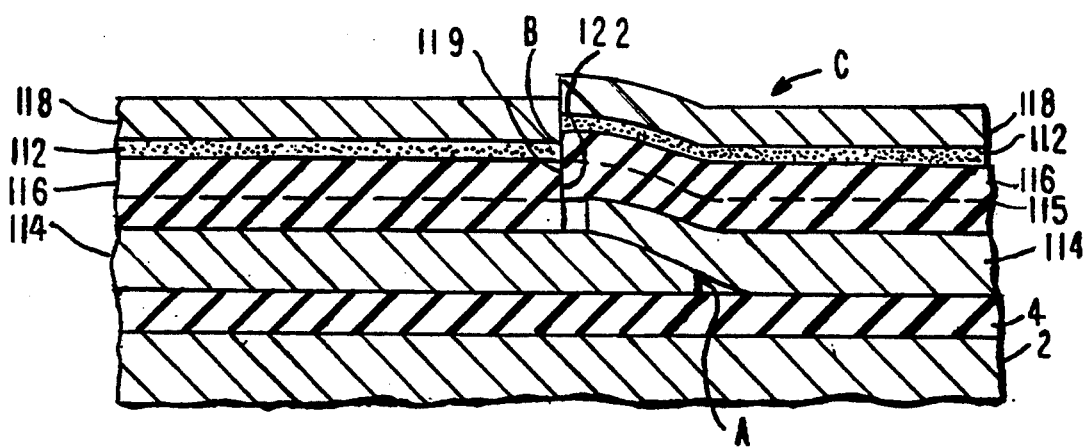
FIG. 4B is a longitudinal and lateral cross-sectional view of the multi-layered tape illustrated in FIG. 4A taken along line 4B13 4B thereof.
Figure 4A:
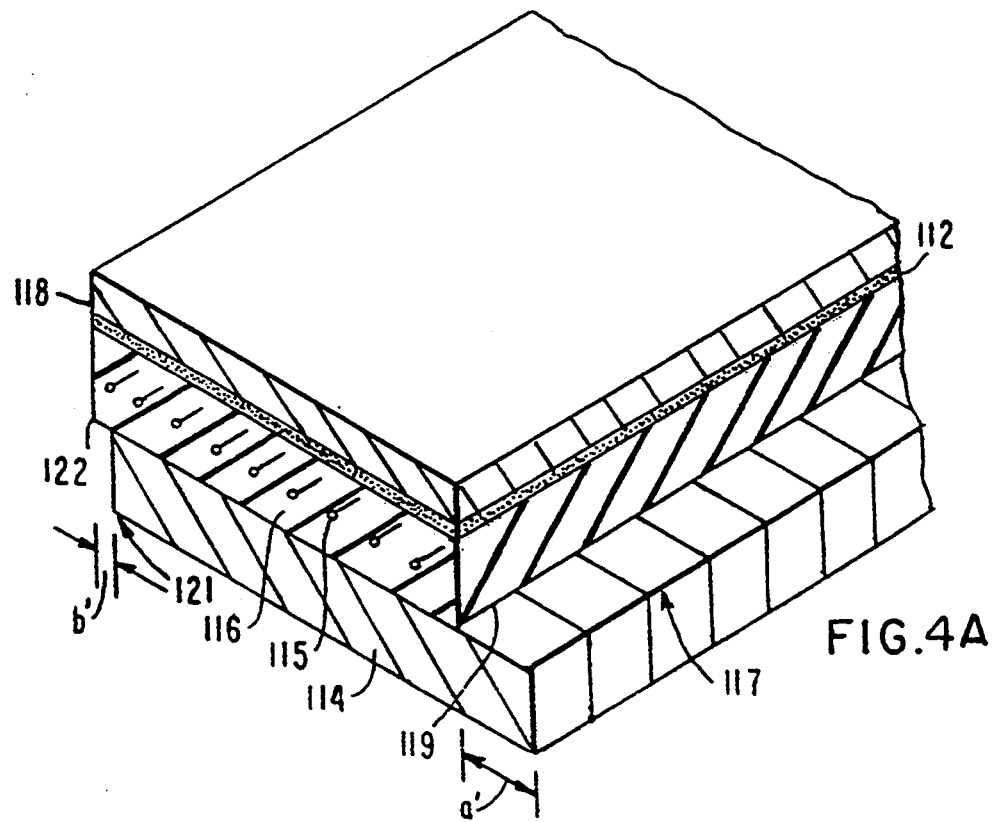
FIG. 4A is a perspective view of the multi-layered tape in accordance with the alternative embodiment of the present invention illustrated in FIG. 3.

Referring now to FIGS. 3, 4A and 4B, an alternative embodiment of the present invention that provides pinching detection and location when the pinching structures are not grounded or are not electrically conductive, will be discussed. Again as with the previous embodiment, illustrated in FIG. 3 a cable is surrounded by an assembly for detecting cable pinching in accordance with the present invention. More specifically, the cable C is surrounded by multi-layer tape 110. As previously, the cable C includes a central conductor 2 and an insulating sheath 4 with the cable C being either an electrical conductor, a hydraulic or pneumatic hose or other type of elongated medium transport cable. Applied to the outer surface 20 of the insulating sheath 4 is the multi-layer tape 110, with this multi-layer tape being illustrated in greater detail in FIGS. 4A and 4B.

The multi-layer tape 110 preferably includes a first semiconductive layer 114, a switching layer 116 and a conductive layer 118. The semiconductive layer 114 is formed as referred to hereinabove with respect to the semiconductive layer 16. Again, it is imperative that the semiconductive layer 114 exhibit the desired final resistance of 10 to 500 ohm/foot and preferably 100-200 ohm/foot. As with the previous embodiment, the dimensions of the multi-layer tape 110 may be altered so long as the requisite final resistance is maintained.

Similarly, the switching layer 116 is formed in a manner identical to that set forth with respect to the switching layer 18 of the previous embodiment and may include longitudinally extending fiberglass threads 115 as illustrated in FIG. 4A. As previously mentioned, the fiberglass threads 115 may be incorporated into the switching layer 116 or may be dispensed with depending upon the desired tensile strength of the resultant multi-layer tape 110.

In order to provide an electrically conductive path when the pinching structures are not grounded or not electrically conductive, a conductive layer 118 is placed in contact with switching layer 116. This conductive layer 118 must have a resistance that is insignificant compared with that of the semiconductive layer 114, and is preferably soft aluminum tape approximately 0.002 to 0.003 inch thick. This conductive layer 118 may be affixed to the switching layer 116 by means of a layer of pressure sensitive conductive adhesive 112.

Referring now to FIG. 4A, as with the previous embodiment, it can be noted that the semiconductive layer 114 is longitudinally offset from the overlying switching layer 116 and the conductive layer 118, the purpose of which will be discussed in greater detail hereinbelow. The switching layer 116 may be provided with reinforcing fiberglass threads 115 as with the previous embodiment which add additional strength to the multilayer tape 110 so that such tape will not buckle or deteriorate during use. The fiberglass threads 15 extend in a substantially longitudinal direction along the length of the multilayer tape 110.

The underlying semiconductive layer 114 includes a lapping edge 17 which is spaced a predetermined distance a' from the edge 119 of the switching layer 116. This predetermined distance is in the range of 0.10 to 0.20 inches and is preferably 0.125 inches. The laterally opposing edge 121 of the semiconductive layer 114 is similarly recessed inwardly from the lateral edge 122 of the switching layer 116 a predetermined distance b' which is in the range of 0.020 to 0.040 inches and preferably 0.031 inches. It should be noted that each of the predetermined distances a' and b' may vary and their particular magnitude will be dependent upon the size and nature of use for the multilayer tape 110.

As can be seen from FIG. 4B, when wrapped in the manner illustrated in FIG. 3 about the cable C, the edges A and B of the multilayer tape 110 will overlap in order to assure that protection of the cable C is uninterrupted along its entire length. As is illustrated in FIG. 4B, the partially vulcanized rubber material of which the semiconductive layer 114 is formed, is compressible along the edges thereof in order to bring the lateral edges 119 and 122 of the switching layer 116 into contact with one another. Further, the edges of the conductive layer 118 are also brought into contact with one another. Consequently, by providing the recessed area along the length of the multilayer tape, the partially vulcanized rubber material is prevented from being exposed along the lateral edges thereof and permits the edges of the switching layer 116 and the conductive layer 118 to mate with one another in order to ensure that the entire semiconductive layer 114 is covered. As discussed hereinabove, the partially vulcanized rubber material possesses self-welding properties when placed in physical contact with itself and thus essentially fuses together in this area. Accordingly, a continuous semiconductive sheath is provided about the cable C with this continuous semiconductive sheath being completely covered by the switching layer 116. By providing the overlapping of the semiconductive layer 114 and thus, a continuous semiconductive sheath, the resistance per unit cable length is again prevented from increasing rapidly with large diameter cables and permits the accurate location of a point at which cable pinching occurs. As with the aforementioned preferred embodiment, the continuous semiconductive sheath formed by the semiconductive layer 114 results in a resistance per unit length that is independent of the width of the tape and which is inversely proportional to the diameter of the cable.

The composite tape 10, described as the preferred embodiment and shown in FIGS. 1, 2A and 2B may also be altered in order to be effective in detecting pinching when the pinching structures are not grounded or not electrically conductive. To do so, a separate conductive layer is applied after the composite tape 10 is in place. This separate conductive layer may be soft aluminum tape 0.002 to 0.003 inch thick having a thin layer of pressure sensitive conductive adhesive to facilitate wrapping, or metallic flexible braid tubing may be applied over the composite tape prior to installation of connectors.

Further, as set forth with respect to the previous embodiments, either the composite tape 10 or the multi-layer tape 110 may be applied to cables during their initial manufacture for subsequent use in an aircraft or other vulnerable equipment or retrofitted to existing equipment.

Once the tape has been manufactured in accordance with any one of the aforementioned embodiments, the tape is wrapped about the cable C and connected to a cable pinching detection and location device of the type set forth in previously mentioned U.S. Pat. No. 4,935,699. When the cable C is pinched, the switching layer will be transformed from a non-conducting state to a conducting state at the pinching point which thus completes an electrical circuit between a grounded structure and the semiconductive layer 16 with respect to the embodiment illustrated in FIG. 1 or between the semiconductive layer 114 and conductive layer 118 of the embodiment illustrated in FIG. 3. Once this circuit has been completed, an alarm circuit will indicate the presence of a pinch along the length of the protected cable C. The particular location of the pinch may be determined in accordance with that set forth in U.S. Pat. No. 4,935,699.

As can be seen from the foregoing, the cable pinching assembly in the form of a multi-layer tape in accordance with the present invention may be provided about cables including conductors or other medium transmitting means either during the initial manufacture of the cable or retrofitted in cables employed in presently existing equipment. It should also be noted that while the cable C is illustrated as including a plurality of conductors or cables, a single conductor may be present or each of the plurality of conductors may be individually wrapped with a multi-layer tape or a single multi-layer tape may be wrapped about the plurality of cables in order to detect the pinching of any one of the plurality of cables. Moreover, the multi-layer tape in accordance with the present invention remains stationary with respect to the cable preferably by way of the tackiness of the partially vulcanized ethylene propylene rubber material from which the semiconductive layer is made and the multi-layer tape may include fiberglass threads to ensure the durability of the multi-layer tape. It is to be noted that these threads may be provided within any one or more of the various layers forming the multi-layer tape. These elements in combination provide for a reliable and accurate detection and location of pinched cables utilized in vulnerable equipment.

It is to be understood that application of the multi-layer tape with a pinching detection and location system is not limited merely to a cable arrangement. The multi-layer tape may be used in combination with a pinching detection and location system for detecting pinching or excessive contact resulting from the relative movement of two or more structural components positioned adjacent to one another. Also, where location is not of concern, such as where the potential pinching may occur in a specific area, the multi-layer tape may be used with appropriate circuitry indicating that pinching has occurred however, the circuitry for realizing the specific location may be eliminated.

While the present invention has been described with reference to preferred embodiments, it will be appreciated by those skilled in the art that the invention may be practiced otherwise than as specifically described herein without departing from the spirit and scope of the invention. It is therefore, to be understood that the spirit and scope of the invention be limited only by the appended claims.

What is claimed is:

1. An assembly for use in a pinching detection and location system, said assembly comprising:
   a layer of semiconductive material;
   a layer of switching material positioned adjacent said layer of semiconductive material, said switching layer being laterally offset from said semiconductive layer transverse to a longitudinal length of said semiconductive layer and non-conductive in an unstressed state and conductive in a stressed state; and
   a reinforcing means for reinforcing the assembly;
   wherein the assembly is wrapped in surrounding relationship about an unarmored cable.

2. The assembly as defined in claim 1, wherein the assembly is in the form of a composite tape for application to existing unarmored cables.

3. The assembly as defined in claim 1, wherein the assembly is in the form of a composite tape for application to the unarmored cables prior to installation in a system.

4. The assembly as defined in claim 1, wherein said layer of semiconductive material is formed from a resin including carbon black, a polymeric binder and a conductive element chosen from a group including silver, nickel and aluminum.

5. The assembly as defined in claim 4, wherein said resin is partially vulcanized ethylene propylene rubber.

6. The assembly as defined in claim 5, wherein the resistivity of said layer of semiconductive material is in the range of 0.0135 to 0.667 ohm-cm.

7. The assembly as defined in claim 1, wherein said layer of semiconductive material has a resistance in the range of 10 to 500 ohms/foot.

8. The assembly as defined in claim 7, wherein said layer of semiconductive material has a resistance in the range of 100 to 200 ohms/foot.

9. The assembly as defined in claim 8, wherein said layer of semiconductor material has a resistivity in the range of 0.0135 to 0.667 ohms-cm.

10. The assembly as defined in claim 1, wherein said reinforcing means includes a plurality of longitudinally extending fiberglass threads embedded in one of said layers.

11. The assembly as defined in claim 10, wherein said fiberglass threads are embedded in said switching layer.

12. The assembly as defined in claim 1, wherein said switching layer is formed of a resiliently compressible material.

13. The assembly as defined in claim 12, wherein said switching layer is formed of a material chosen from a group including polyurethanes and silicones.

14. A conduit having an axial length, which length is susceptible to being pinched, said conduit comprising:
   a core having an insulating means in surrounding relationship therewith for transporting a transient medium;
   a semiconductive layer formed from a partially vulcanized ethylene propylene rubber including a conductive element chosen from a group including carbon black, silver, nickel and aluminum; and
   a switching layer positioned adjacent to and laterally offset from said semiconductive layer transverse to a longitudinal length of said semiconductive layer;
   wherein said layers are wrapped in a surrounding relationship about said insulating means.

15. The conduit as defined in claim 14, wherein said semiconductive layer and said switching layer are in the form of a composite tape with said semiconductive layer underlying said switching layer.

16. The conduit as defined in claim 14, wherein said semiconductive layer has a resistance in the range of 10 to 500 ohms/foot.

17. The conduit as defined in claim 16, wherein said semiconductive layer has a resistance in the range of 100 to 200 ohms/foot.

18. The conduit as defined in claim 17, wherein said semiconductive layer has a resistivity in the range of 0.0133 to 0.667 ohms-cm.

19. The conduit as defined in claim 15, further comprising a reinforcing means for reinforcing said layers, wherein said reinforcing means includes a plurality of fiberglass threads embedded in at least one of said semiconductive layer and said switching layer.

20. The conduit as defined in claim 19, wherein said fiberglass threads extend substantially longitudinally throughout said layer.

21. An assembly for use in a pinching detection and location system, said assembly comprising;
   a semiconductive layer for conducting a detection current; and
   a switching layer for conducting the detection current when the assembly is pinched, said switching layer being positioned adjacent to and laterally offset from said semiconductive layer transverse to a longitudinal length of said semiconductive layer;

wherein said semiconductive layer is formed of partially vulcanized ethylene propylene rubber.

22. The assembly as defined in claim 21, further comprising a conductive layer, wherein said switching layer is positioned substantially between said semiconductive layer and said conductive layer.

23. The assembly as defined in claim 22, wherein said assembly is in the form of a multilayer tape with said semiconductive layer being laterally offset from said switching layer and said conductive layer.

24. The assembly as defined in claim 21, wherein said semiconductive layer further includes carbon particles and conductive particles chosen from a group including silver, nickel and aluminum.

25. The assembly as defined in claim 21, wherein said semiconductive layer has a resistance in the range of 100 to 200 ohms/foot.

26. The assembly as defined in claim 21, wherein said semiconductive layer has a resistivity in the range of 0.0133 to 0.667 ohm-cm and preferably 0.267 ohm-cm.

27. The assembly as defined in claim 21, wherein said switching layer is formed of a resiliently compressible material.

28. The assembly as defined in claim 27, wherein said resiliently compressible material is chosen from a group including polyurethanes and silicones.

29. The assembly as defined in claim 21, further comprising a reinforcing means for reinforcing said assembly.

30. The assembly as defined in claim 29, wherein said reinforcing means includes a plurality of longitudinally extending fiberglass threads embedded in one of said layers.

31. The assembly as defined in claim 30, wherein said fiberglass threads are embedded in said switching layer.

* * * * *